United States Patent [19]
Morikawa et al.

[11] Patent Number: 6,118,916
[45] Date of Patent: Sep. 12, 2000

[54] IC FOR CONVERTING OPTICAL SIGNAL TO ELECTRICAL SIGNAL

[75] Inventors: Takenori Morikawa; Tsutomu Tashiro, both of Tokyo, Japan

[73] Assignee: NEC Corporation, Tokyo, Japan

[21] Appl. No.: 08/940,150

[22] Filed: Sep. 29, 1997

[30]  Foreign Application Priority Data

Sep. 27, 1996  [JP]  Japan  .................................. 8-256430

[51] Int. Cl.[7] .................................................. G02B 6/30
[52] U.S. Cl. ............................ 385/49; 385/14; 385/88; 385/89; 257/432; 257/466
[58] Field of Search ................... 385/14, 49–52, 385/88–93; 257/432, 466, 83, 84

[56]  References Cited

U.S. PATENT DOCUMENTS

| | | | |
|---|---|---|---|
| 4,488,163 | 12/1984 | Bluzer et al. | 257/222 |
| 4,588,896 | 5/1986 | Abbas | 250/214 LS |
| 5,082,793 | 1/1992 | Li | 437/24 |
| 5,534,442 | 7/1996 | Parker et al. | 438/25 |
| 5,611,008 | 3/1997 | Yap | 385/14 |

FOREIGN PATENT DOCUMENTS 8-316449  11/1996  Japan .

*Primary Examiner*—Hemang Sanghavi
*Attorney, Agent, or Firm*—Hutchins, Wheeler & Dittmar

[57]  ABSTRACT

A parallel light receiving OEIC comprising a light receiving OEIC layed out in an array form, the light receiving OEIC having an optical fiber fixing groove, provided on a silicon substrate, for efficiently introducing light from an optical fiber into a photodiode, wherein at least one optical fiber fixing groove is provided between light receiving ICs for respective channels. This constitution enables the substantial distance between channels to be increased without increasing the layout area, resulting in reduced interference of noises generated in respective channels with each other, which markedly reduces the influence of crosstalk without increasing the layout area of the parallel light receiving IC.

16 Claims, 9 Drawing Sheets

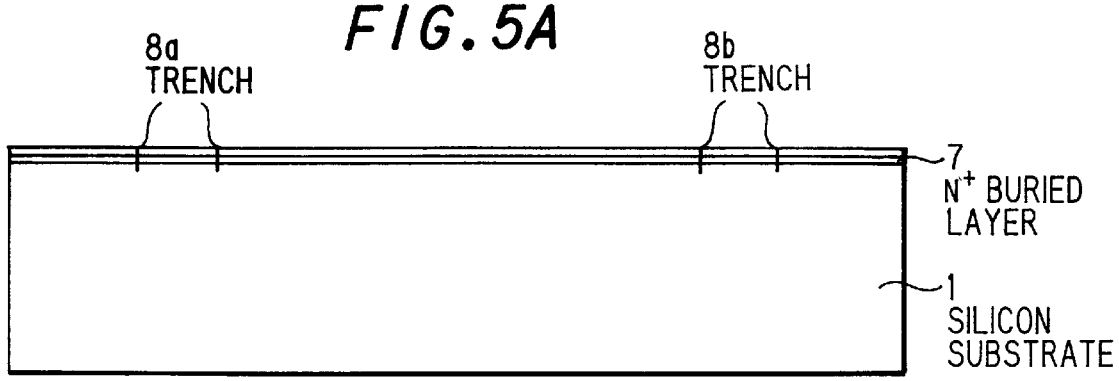
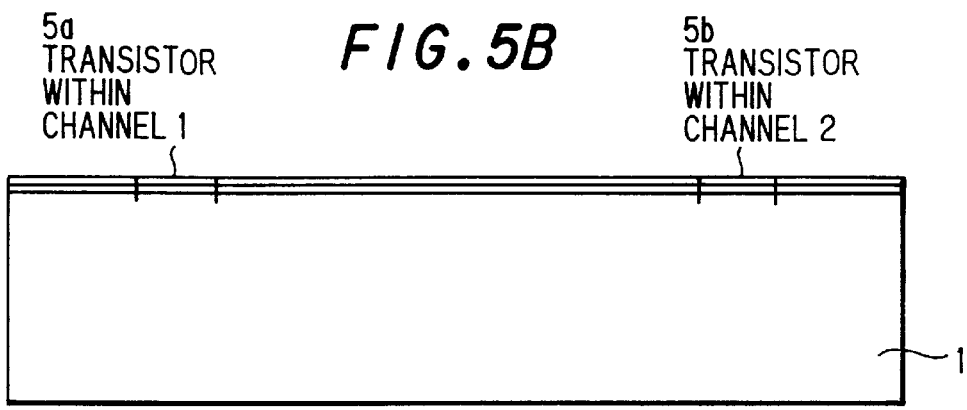
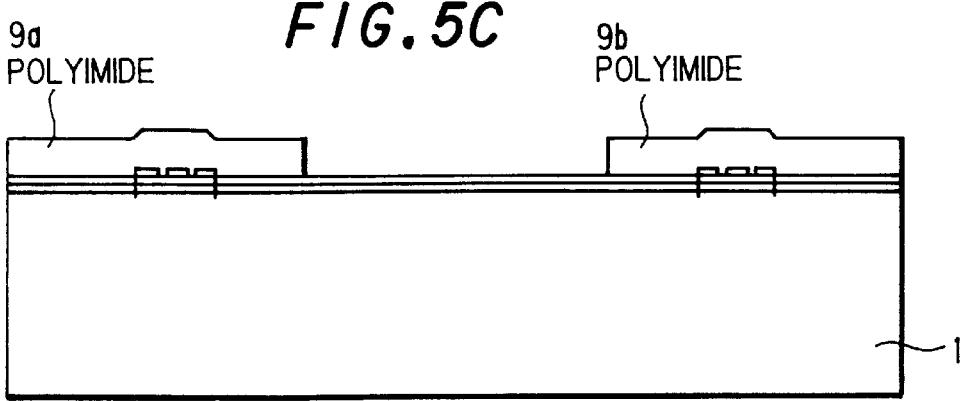

IC FOR CONVERTING OPTICAL SIGNAL TO ELECTRICAL SIGNAL

FIELD OF THE INVENTION

The present invention relates to an OEIC (optical/electrical conversion IC) for use in optical transmission and particularly to a parallel light receiving OEIC capable of coping with optical interconnection.

BACKGROUND OF THE INVENTION

A conventional OEIC which receives light from an optical fiber and converts the optical signal to an electrical signal comprises an optical fiber fixing groove for fixing an optical fiber and facilitating the introduction of light into a photodiode and a light receiving IC section, the optical fiber fixing groove and the light receiving IC section being provided on a common silicon substrate.

Conventional OEICs include, for example, a semiconductor device disclosed in Japanese Patent Application No. 52700/1995. This OEIC comprises an optical fiber fixing groove for fixing an optical fiber, a photodiode for converting an optical signal output from an optical fiber to an electrical signal, and a receiving IC for processing a signal which has been converted from an optical signal to an electrical signal by the photodiode, and a plurality of channels of this structure are provided in parallel on a common substrate.

When the OEIC is applied in this way to a parallel light receiving IC for processing lights transmitted in parallel respectively for a plurality of channels, an electrical signal generated in a transistor within one channel interferes with another channel to produce a noise, that is, unfavorably resulting in crosstalk. In order to reduce the influence of the crosstalk, for example, an attempt has been made to increase the capacity component between light receiving IC sections for respective channels by newly providing a trench for element separation on the outermost periphery of the light receiving IC sections or to delay the propagation of the noise by increasing the distance between the light receiving IC sections.

In the conventional parallel light receiving IC, the additional provision of a trench for element separation around the receiving IC sections cannot fully prevent the influence of the crosstalk. This is because the trench for element separation has a dimension of not more than 1 μm in width and 10 μm in depth which is unsatisfactory for preventing noises from propagating through the substrate.

Further, the distance between ICs for respective channels in the parallel light receiving IC cannot be increased without any restriction because an excessive increase in the distance between ICs for respective channels results in increased chip size, which is disadvantageous for integration.

SUMMARY OF THE INVENTION

Accordingly, an object of the present invention is to provide a small-size, high-reliable, high-performance, and parallel light receiving IC which can minimize the influence of crosstalk between channels without increasing the layout area on a chip.

According to the first feature of the invention, an IC for converting an optical signal to an electrical signal, comprises: a semiconductor substrate; and, provided on the semiconductor substrate, an optical fiber fixing groove for fixing an optical fiber and efficiently introducing an optical signal into a photodetector and an light receiving IC section for processing a signal which has been converted from an optical signal to an electrical signal by the photodetector, the optical fiber fixing groove comprising at least one groove provided between a light receiving IC section for a first channel and a light receiving IC section for a second channel adjacent to the light receiving IC section for the first channel.

According to the second feature of the invention, an IC for converting an optical signal to an electrical signal, comprises: a semiconductor substrate; and, provided on the semiconductor substrate, an optical fiber fixing groove for fixing an optical fiber and efficiently introducing an optical signal into a photodetector and an light receiving IC section for processing a signal which has been converted from an optical signal to an electrical signal by the photodetector, at least one dummy groove being provided between a light receiving IC section for a first channel and a light receiving IC section for a second channel adjacent to the light receiving IC section for the first channel.

According to the third feature of the invention, an IC for converting an optical signal to an electrical signal, comprises: a semiconductor substrate; and, provided on the semiconductor substrate, an optical fiber fixing groove for fixing an optical fiber and efficiently introducing an optical signal into a photodetector and an light receiving IC section for processing a signal which has been converted from an optical signal to an electrical signal by the photodetector, at least one dummy groove being provided between a light receiving IC section for a first channel and a light receiving IC section for a second channel adjacent to the light receiving IC section for the first channel, a light receiving IC section for a third channel being provided adjacent to the light receiving IC section for the second channel in its side remote from the dummy groove, the optical fiber fixing groove comprising first, second and third grooves, the first groove being provided on the side of the light receiving IC section for the first channel remote from the dummy groove, the second and third grooves being provided between the light receiving IC section for the second channel and the light receiving IC section for the third channel.

BRIEF DESCRIPTION OF THE DRAWINGS

The invention will be explained in more detail in conjunction with appended drawings, wherein:

FIGS. 5A, 5B, and 5C are cross-sectional views, taken on line A-B of FIG. 3, showing a production process of the parallel light receiving OEIC according to the first preferred embodiment of the present invention;

DESCRIPTION OF THE PREFERRED EMBODIMENTS

Before explaining an OEIC in the preferred embodiment according to the invention, the aforementioned conventional OEIC will be explained in FIG. 1 and 2.

Figure 1:
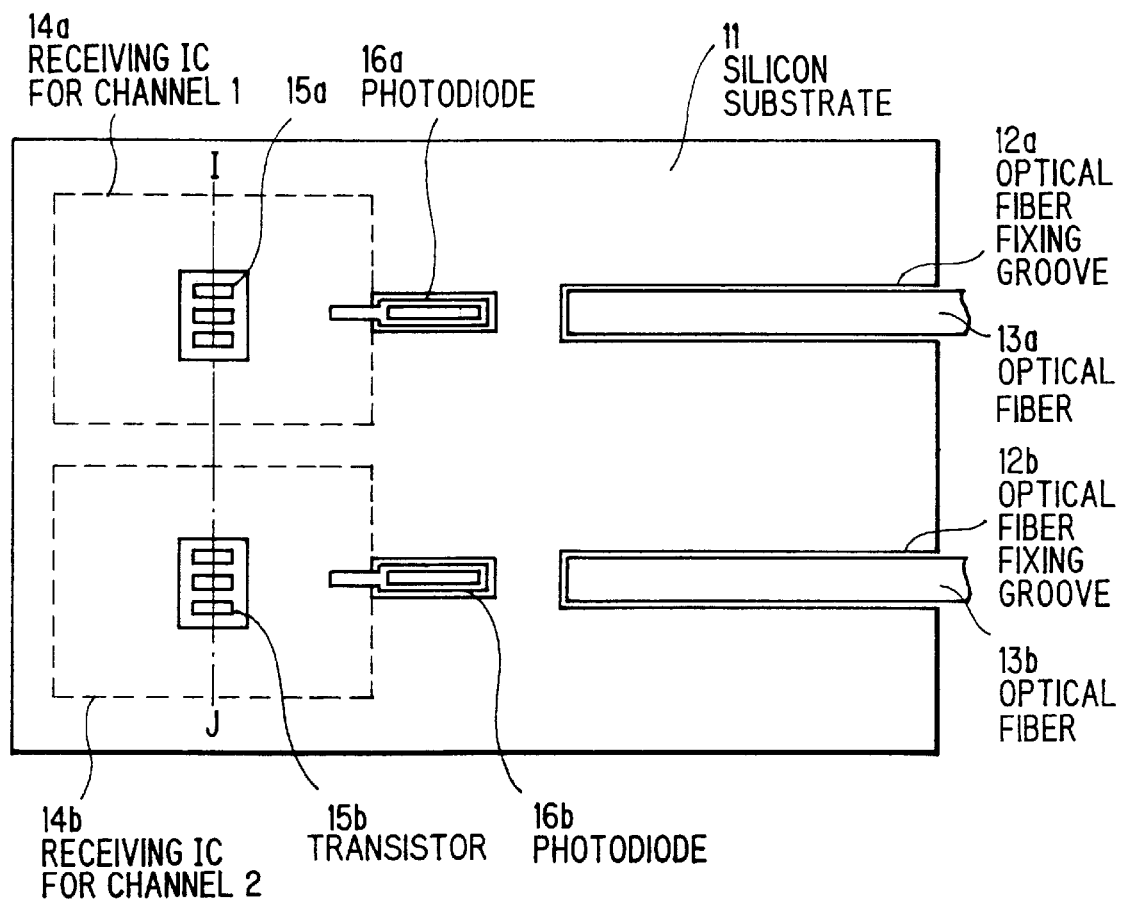
FIG. 1 is a plan view showing the construction of a conventional parallel receiving OEIC.

FIG. 1 shows a conventional OEIC disclosed in Japanese Patent Application No. 52700/1995. This OEIC has a structure comprising an optical fiber fixing groove 12a for fixing an optical fiber 13a, a photodiode 16a, and a receiving IC 14a for processing a signal which has been converted from an optical signal to an electrical signal by the photodiode 16a, the optical fiber fixing groove 12a, the photodiode 16a, and the receiving IC 14a being provided on an identical substrate. The OEIC shown in FIG. 1 is of two channel type.

Figure 2:
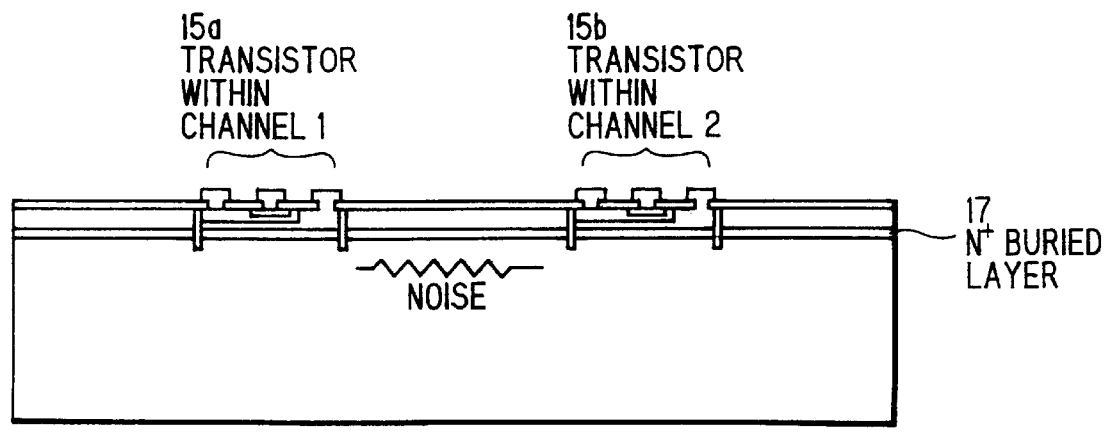
FIG. 2 is a cross-sectional view taken on line I-J of FIG. 1.

FIG. 2 shows the mechanism of the creation of the above-mentioned crosstalk. Specifically, when the OEIC is applied to a parallel light receiving IC for processing lights transmitted parallel respectively for a plurality of channels, an electrical signal generated in a transistor 15a within a first channel interferes with a second channel to produce a noise, that is, unfavorably resulting in crosstalk. In order to suppress the influence of the crosstalk, for example, an attempt has been made to increase the capacity component between light receiving IC sections for respective channels by newly providing a trench for element separation on the outermost periphery of the light receiving IC sections or to delay the propagation of the noise by increasing the distance between the light receiving IC sections.

Figure 3:
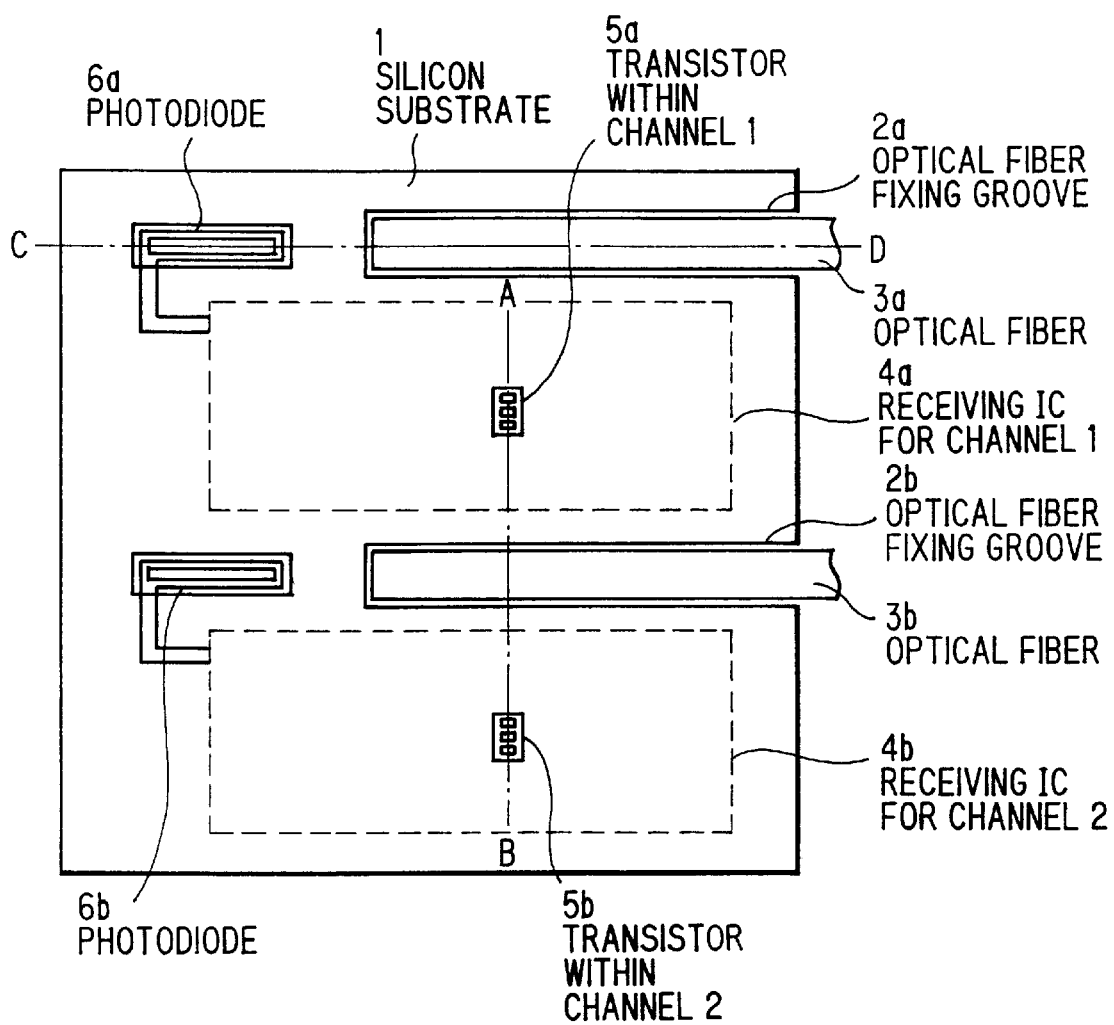
FIG. 3 is a plane view showing the construction of parallel light receiving OEIC according to the first preferred embodiment of the present invention.
Figure 4A:
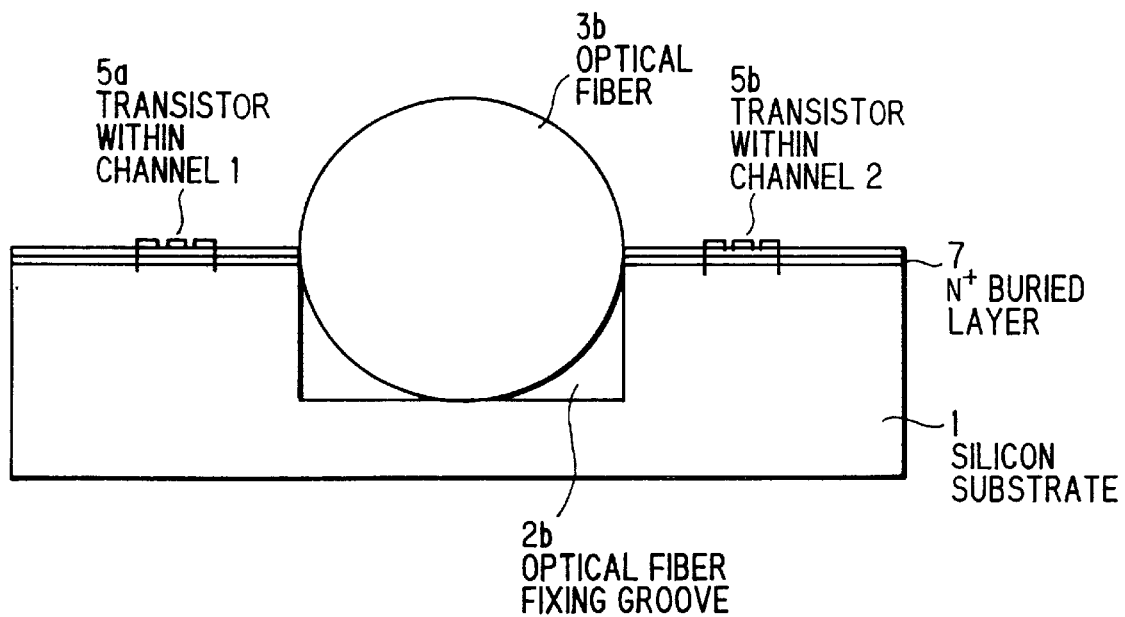
FIG. 4A is a cross-sectional view taken on line A-B of FIG. 3.
Figure 4B:
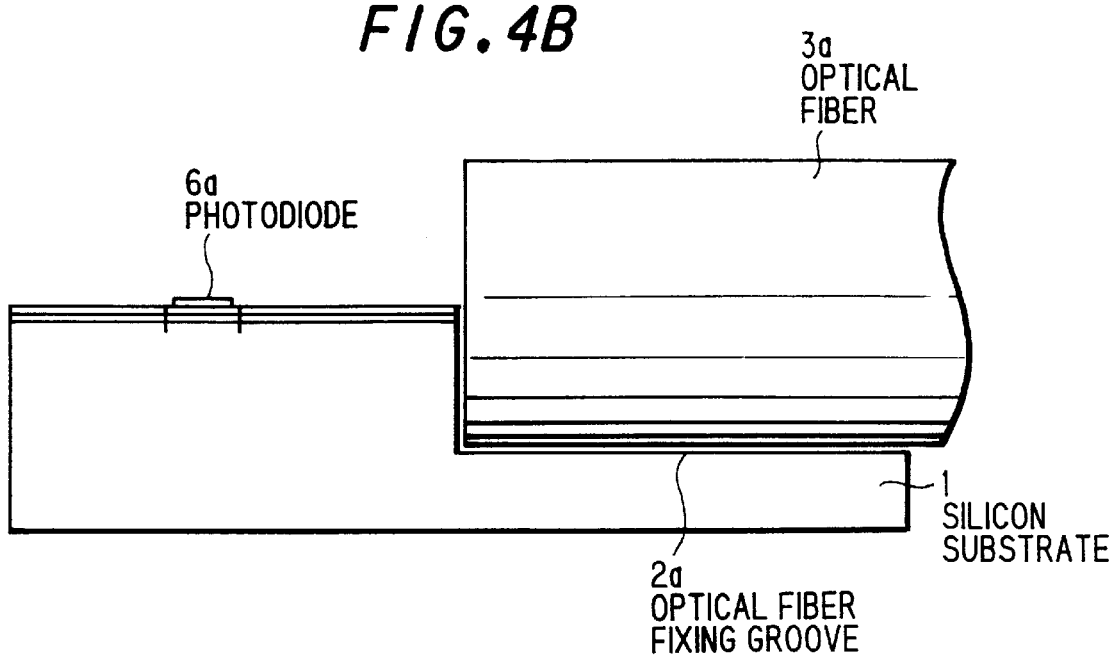
FIG. 4B is a cross-sectional view taken on line C-D of FIG. 3.

Next, an OEIC in the first preferred embodiment according to the invention will be explained in FIG. 3 and FIGS. 4A and 4B.

The light receiving OEIC for each channel comprises an optical fiber 3a fixed, after regulation of the optical axis in order to efficiently introduce light into a photodiode 6a, to an optical fiber fixing groove 2a formed in a silicon substrate 1, a photodiode 6a, having a planar structure, prepared in the silicon substrate 1, and a receiving IC 4a for amplifying and encoding a signal which has been converted from an optical signal to an electrical signal by the photodiode 6a, the above elements being provided on an identical silicon substrate. The light receiving OEIC comprising the optical fiber 3a, the optical fiber fixing groove 2a adapted for fixing the fiber, the photodiode 6a provided in a planar form onto a silicon substrate 1, and the receiving IC 4a comprised of a bipolar transistor 5a are layed out in an array form on an identical chip, and the optical fiber fixing groove with the optical fiber fixed thereto is provided between the receiving ICs for respective channels. The OEIC shown in FIG. 3 is of two channel type.

Figure 6A:
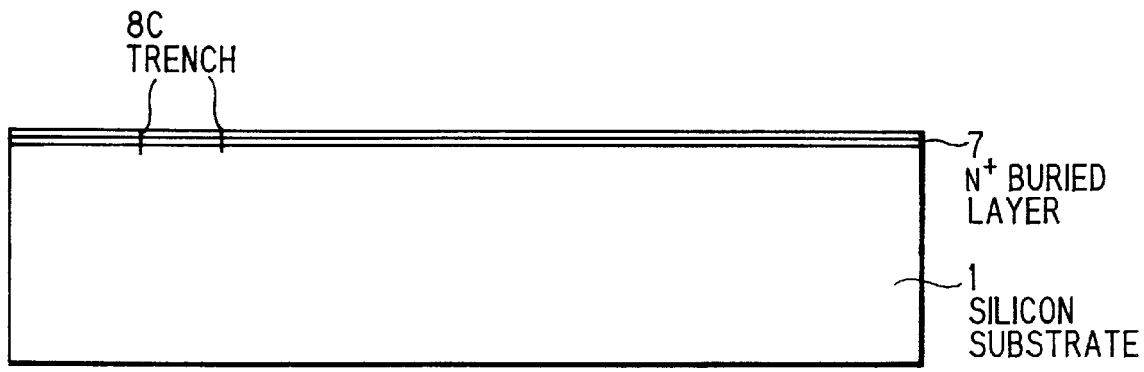
FIGS. 6A, 6B, and 6C are cross-sectional views, taken on line C-D of FIG. 3, showing a production process of the parallel light receiving OEIC according to the first preferred embodiment of the present invention.
Figure 6B:
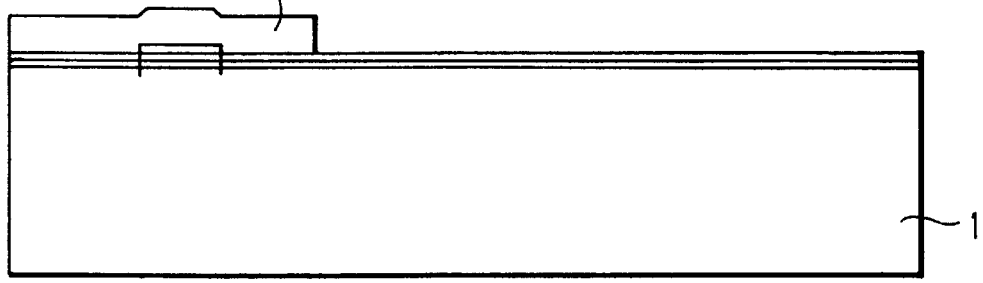
Figure 6C:
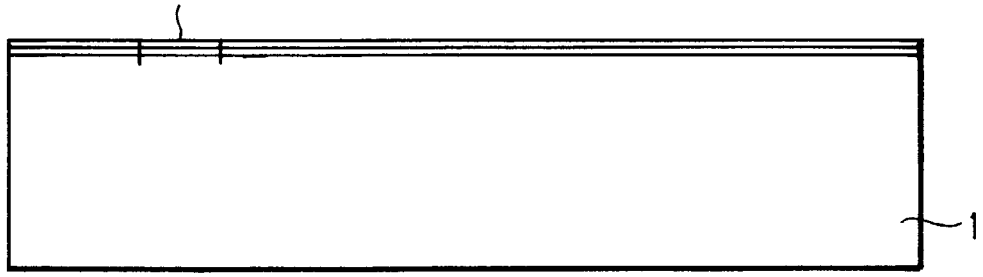

Next, a process for producing this light receiving OEIC will be explained with reference to FIGS. 5A, 5B, and 5C and FIGS. 6A, 6B, and 6C. FIGS. 5A, 5B, and 5C are cross-sectional views, taken on line A-B of FIG. 3, showing the production process, and FIGS. 6A, 6B, and 6C are cross-sectional views, taken on line C-D of FIG. 3, showing the production process. A bipolar transistor constituting a receiving IC is first formed. After an N+ buried layer 7 is formed on a silicon substrate 1, an N type epitaxial layer is allowed to grow. A groove is formed on the silicon substrate by anisotropic etching, and a BPSG layer is embedded to form trenches 8a, 8b, thereby conducting element separation (FIG. 5A). At that time, element separation for a photodiode 6b is simultaneously performed (FIG. 6A). Next, a base region and an emitter region are formed by ion implantation as a conventional bipolar process to provide receiving IC 4a, 4b sections including transistors 5a, 5b (FIG. 5B).

A low concentration P type region and a high concentration P type contact layer are continuously formed by ion implantation in a site where a photodiode is to be formed, thereby providing a photodiode 6b section (FIG. 6B). Subsequently, electrodes of respectively a bipolar transistor and a photodiode are simultaneously formed.

Finally, in order to form an optical fiber fixing groove for permitting light to be efficiently introduced into the photodiode, as shown in FIGS. 5c and 6c, photosensitive polyimide layers 9a, 9b are provided as a mask, and the silicon substrate 1 is etched according to the diameter of the optical fiber, for example, in a size of 125 μm in width and 65 μm in depth. Thus, a light receiving OEIC as shown in FIGS. 3 and 4 is prepared by the above process.

Figure 7:
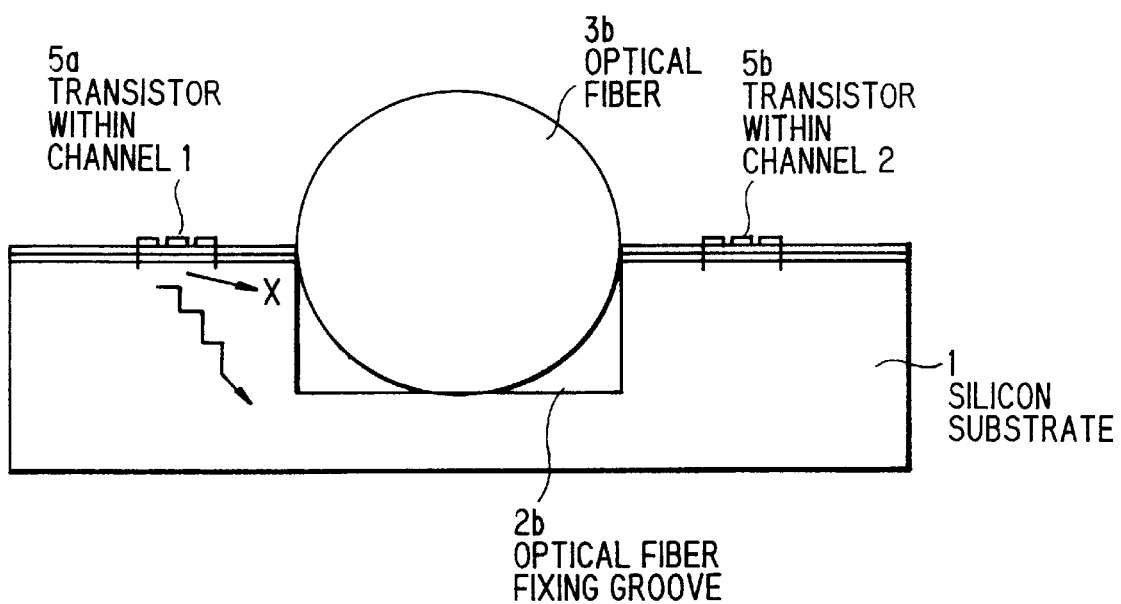
FIG. 7 is a cross-sectional view illustrating the operation of the parallel light receiving OEIC according to the first preferred embodiment of the present invention.

The mode of operation of the present invention will be explained in more detail with reference to FIG. 7. As shown in FIG. 7, an optical fiber fixing groove 2b is provided between a transistor 5a constituting a receiving IC 4a within a first channel and a transistor 5b constituting a receiving IC 4b within a second channel. By virtue of this constitution, a noise signal produced in the first channel is less likely to be propagated as compared with the case where this groove is not provided. Therefore, the influence of the crosstalk can be markedly reduced. Further, since this can be attained simply by moving the layout position of the optical fiber fixing groove in the prior art, the layout area of the chip remains unchanged, which is advantageous from the viewpoint of a reduction in size.

Figure 8:
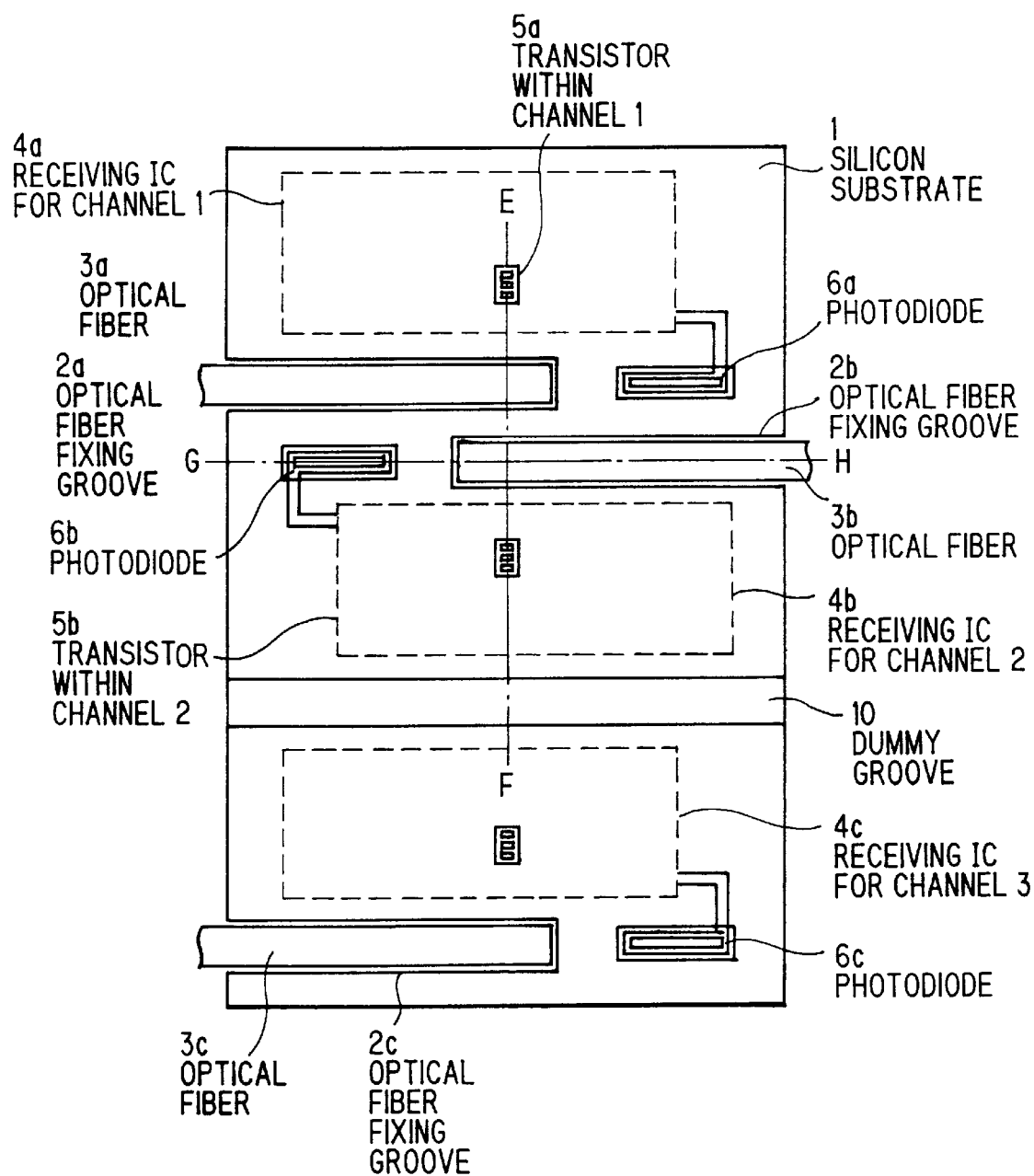
FIG. 8 is a plan view showing the construction of a parallel light receiving OEIC according to the second preferred embodiment of the present invention.
Figure 9A:
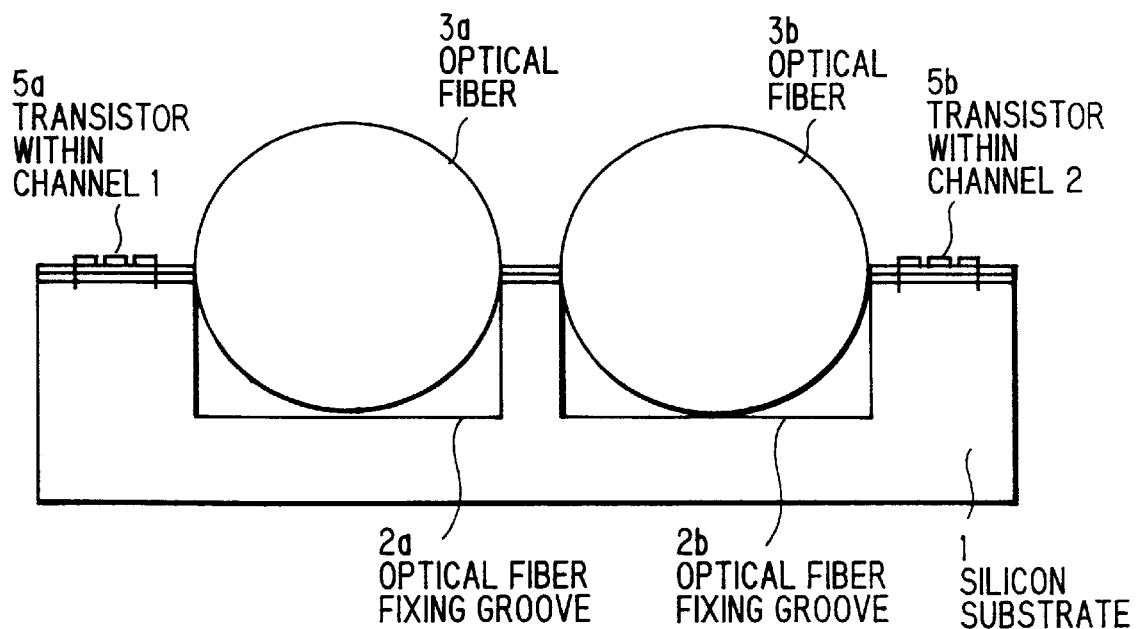
FIG. 9A is a cross-sectional view taken on line E-F of FIG. 8.
Figure 9B:
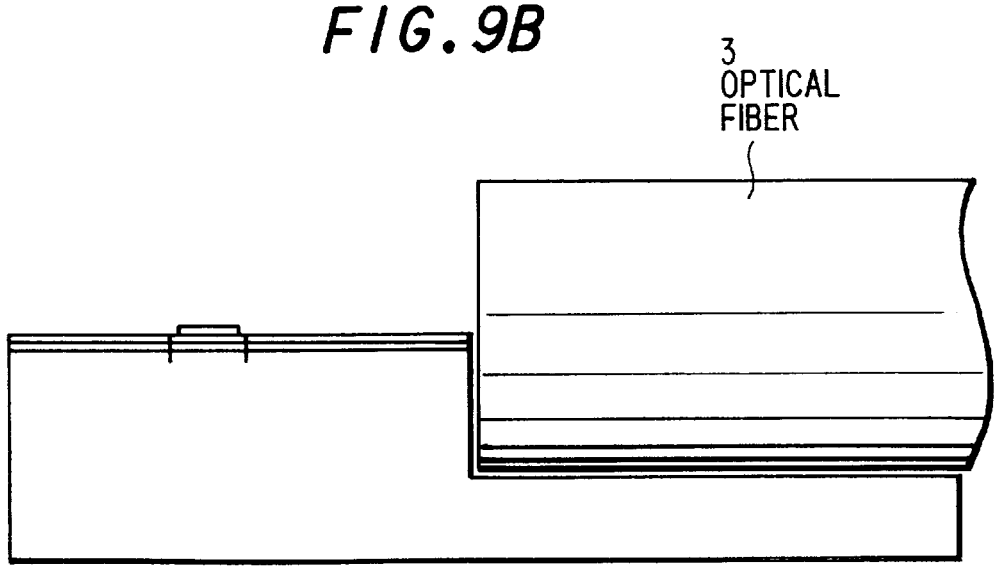
FIG. 9B is a cross-sectional view taken on line G-H of FIG. 8.

Next, an OEIC in the second preferred embodiment according to the invention will be explained in FIG. 8 and FIGS. 9A and 9B. FIG. 8 is a plan view of a parallel light receiving OEIC according to the second preferred embodiment of the present invention. FIG. 9A is a cross-sectional view taken on line E-F of FIG. 8, and FIG. 9B is a cross-sectional view taken on line G-H of FIG. 8. Two optical fiber fixing grooves 2a, 2b, an optical fiber fixing groove for a first channel and an optical fiber fixing groove for a second channel, are provided between the first channel and the second channel. Further, a dummy groove 10 is provided between the second channel and the third channel.

Figure 10A:
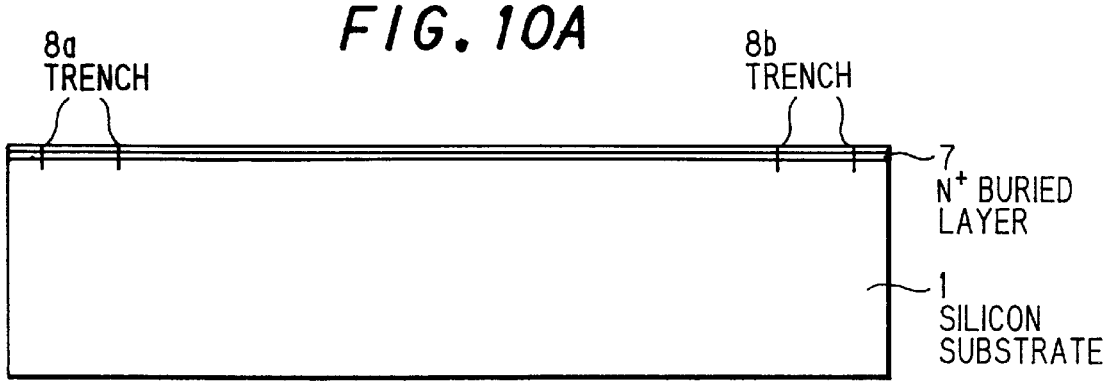
FIGS. 10A, 10B, and 10C are cross-sectional views, taken on line E-F of FIG. 8, showing a production process of the parallel light receiving OEIC according to the second preferred embodiment of the present invention.
Figure 10B:
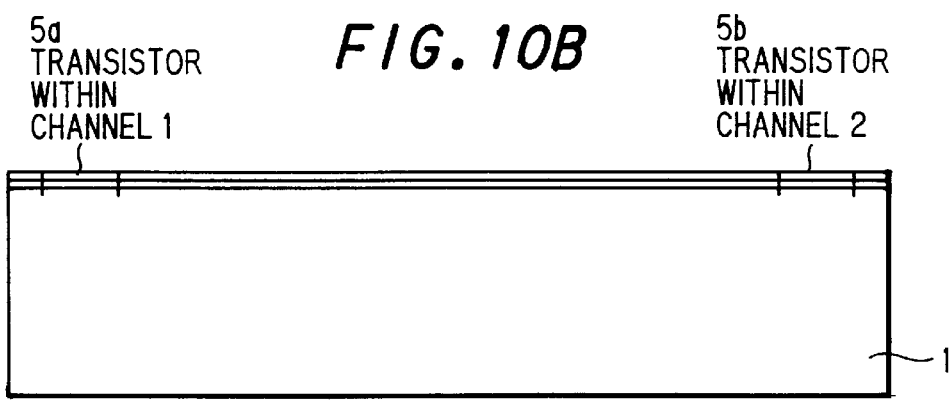
Figure 10C:
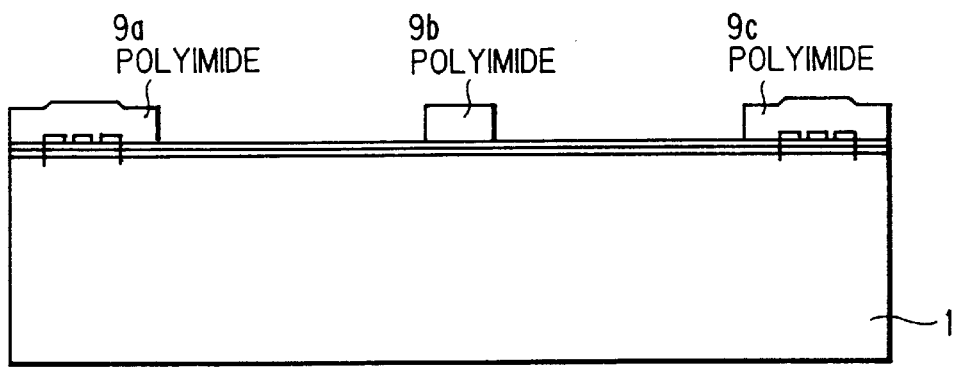

Next, a process for producing this light receiving OEIC will be explained with reference to FIG. 10. The steps for producing a bipolar transistor constituting the receiving IC and a photodiode are the same as those described above in connection with the first preferred embodiment of the present invention. In the final step, as shown in FIG. 10, in order to form optical fiber fixing grooves 2a, 2b for permitting light to be efficiently introduced into the photodiode, photosensitive polyimide layers 9a, 9b, 9c are provided as a mask, and the silicon substrate 1 is etched, for example, in a size of 125 μm in width and 65 μm in depth. At that time, a dummy groove 10 is simultaneously formed.

Thus, a light receiving OEIC as shown in FIGS. 8, 9A, and 9B is prepared by the above process. The optical fiber fixing grooves 2a and 2b are provided between the first channel and the second channel, and the dummy grove 10 should be additionally provided between the second channel and the third channel, resulting in slightly increased chip area. As compared with the first preferred embodiment, however, the channels are more surely two-dimensionally cut off from each other by the fixing grooves, increasing the substantial distance between the channels, which enables the propagation of the noise to be more effectively prevented.

As described above, according to the present invention, since an optical fiber fixing groove or a dummy groove is provided between receiving ICs for respective channels, the crosstalk between channels can be markedly reduced. This is because a large depth of the groove of not less than 60 μm permits the substantial distance between channels to be increased without increasing the layout area.

The invention has been described in detail with particular reference to preferred embodiments, but it will be understood that variations and modifications can be effected within the scope of the invention as set forth in the appended claims.

What is claimed is:

1. A parallel light receiving OEIC comprising:

a semiconductor substrate; and, provided on the semiconductor substrate, an optical fiber fixing groove for fixing an optical fiber and efficiently introducing an optical signal into a photodetector and a light receiving IC section for processing a signal which has been converted from an optical signal to an electrical signal by the photodetector, the optical fiber fixing groove comprising at least one groove provided between a light receiving IC section for a first channel and a light receiving IC section for a second channel adjacent to the light receiving IC section for the first channel.

2. The parallel light receiving OEIC according to claim 1, wherein the optical fiber fixing groove comprises first and second grooves provided between the light receiving IC section for the first channel and the light receiving IC section for a second channel, the first groove being extended from one side of the substrate toward the other opposite side of the substrate, the second groove being extended from the side of the substrate opposite to the side of the substrate from which first groove is extended.

3. An parallel light receiving OEIC comprising:

a semiconductor substrate; and, provided on the semiconductor substrate, an optical fiber fixing groove for fixing an optical fiber and efficiently introducing an optical signal into a photodetector and a light receiving IC section for processing a signal which has been converted from an optical signal to an electrical signal by the photodetector, at least one dummy groove being provided between a light receiving IC section for a first channel and a light receiving IC section for a second channel adjacent to the light receiving IC section for the first channel.

4. The parallel light receiving OEIC according to claim 3, wherein the optical fiber fixing groove comprises first and second grooves, the first groove being provided on the side of the light receiving IC section for the first channel remote from the dummy groove, the second groove being provided on the side of the light receiving IC section for the second channel remote from the dummy groove.

5. An parallel light receiving OEIC comprising:

a semiconductor substrate; and, provided on the semiconductor substrate, an optical fiber fixing groove for fixing an optical fiber and efficiently introducing an optical signal into a photodetector and a light receiving IC section for processing a signal which has been converted from an optical signal to an electrical signal by the photodetector, at least one dummy groove being provided between a light receiving IC section for a first channel and a light receiving IC section for a second channel adjacent to the light receiving IC section for a first channel, a light receiving IC section for a third channel being provided adjacent to the light receiving IC section for the second channel in its side remote from the dummy groove, the optical fiber fixing groove comprising first, second and third grooves, the first groove being provided on the side of the light receiving IC section for the first channel remote from the dummy groove, the second and third grooves being provided between the light receiving IC section for the second channel and the light receiving IC section for the third channel.

6. An OEIC, comprising:

(a) a semiconductor substrate;

(b) first and second IC sections disposed on the substrate;

(c) at least a first photodiode coupled to the first IC section;

(d) a first optical fiber fixing groove coupled to the first photodiode and disposed in the substrate between the IC sections, whereby the groove reduces the likelihood of noise propagation between the IC sections.

7. A OEIC, according to claim 6, further comprising:

(d) a second optical fiber fixing groove disposed in the substrate between the first and second IC sections.

8. An OEIC, according to claim 7, wherein the second optical fiber fixing groove is coupled to the second IC section by a second photodiode.

9. An OEIC, according to claim 7, wherein the first optical fiber fixing groove is substantially parallel to the second optical fiber fixing groove.

10. An OEIC, according to claim 7, further comprising:

(e) a third IC section disposed on the substrate; and (f) a dummy groove, disposed between the third IC section and at least one of: the first and second IC sections, whereby the dummy groove reduces noise propagation related to the third IC section.

11. An OEIC, according to claim 6, wherein the depth of the first fiber fixing groove is approximately 65 micrometers.

12. A method of reducing noise between IC sections in an OEIC, comprising:

(a) forming a first IC section and a first photodiode in a substrate;

(b) forming a second IC section in the substrate; and (c) forming a first optical fiber fixing groove in the substrate between the first and second IC sections, the first optical fiber fixing groove coupled to the first photodiode and having a depth sufficient to reduce the likelihood of noise being propagated between the IC sections.

13. A method according to claim 12, wherein forming the first groove includes etching the substrate to a depth of approximately 65 micrometers.

14. A method according to claim 12, further comprising:

(e) forming a second groove on the substrate between the first and second IC sections; and (f) providing a second photodiode on the substrate to couple the second groove to the second IC section.

15. A method according to claim 14, further comprising:
(g) forming a third IC section on the substrate; and
(h) forming a third groove on the substrate between the third IC section and one of: the first and second IC sections.

16. A method according to claim 15, wherein forming the grooves includes etching the substrate to a depth of approximately 65 micrometers for at least one of the grooves.

* * * * *